United States Patent
Naruse et al.

(10) Patent No.: US 11,848,251 B2
(45) Date of Patent: Dec. 19, 2023

(54) SEMICONDUCTOR DEVICE

(71) Applicant: AISIN CORPORATION, Aichi (JP)

(72) Inventors: Takanobu Naruse, Kariya (JP);
Hiroyoshi Araki, Kariya (JP)

(73) Assignee: AISIN CORPORATION, Aichi (JP)

( * ) Notice: Subject to any disclaimer, the term of this patent is extended or adjusted under 35 U.S.C. 154(b) by 176 days.

(21) Appl. No.: 17/311,386

(22) PCT Filed: Dec. 11, 2019

(86) PCT No.: PCT/JP2019/048467
§ 371 (c)(1),
(2) Date: Jun. 7, 2021

(87) PCT Pub. No.: WO2020/179171
PCT Pub. Date: Sep. 10, 2020

(65) Prior Publication Data
US 2022/0028755 A1    Jan. 27, 2022

(30) Foreign Application Priority Data

Mar. 5, 2019   (JP) ................................. 2019-039472

(51) Int. Cl.
*H01L 23/46*    (2006.01)
*H01L 23/467*    (2006.01)
(Continued)

(52) U.S. Cl.
CPC ........ *H01L 23/467* (2013.01); *H01L 23/3672* (2013.01); *H01L 23/4334* (2013.01); *H05K 7/20145* (2013.01)

(58) Field of Classification Search
CPC ............... H01L 23/467; H01L 23/3672; H01L 23/4334; H05K 7/20145; H05K 7/20154; F28F 3/02; F28F 13/06
See application file for complete search history.

(56) References Cited

U.S. PATENT DOCUMENTS 9,578,786 B1 * 2/2017 Beall ................. H05K 7/20727
2002/0159232 A1 * 10/2002 Beitelmal ................. G06F 1/20
361/695

(Continued)

FOREIGN PATENT DOCUMENTS

JP     64-28896 A    1/1989
JP     03-153095 A   7/1991

(Continued)

OTHER PUBLICATIONS

International Search Report of PCT/JP2019048467 dated Mar. 10, 2020 [PCT/ISA/210].

*Primary Examiner* — Mandeep S Buttar
(74) *Attorney, Agent, or Firm* — Sughrue Mion, PLLC

(57) ABSTRACT

A semiconductor device (1) includes a semiconductor module (20) and a fan device (30). The semiconductor module (20) includes a module board (21), a first element (22) mounted on the module board (21), and a second element (23a) having a smaller heat generation amount and lower heat resistance. In a flowing direction of an air flow (F) formed by driving the fan device (30), the fan device (30) is disposed downstream of the first element (22) and the second element (23a), and the first element (22) is disposed downstream of the second element (23a).

5 Claims, 4 Drawing Sheets

(51) Int. Cl.
*H01L 23/367* (2006.01)
*H01L 23/433* (2006.01)
*H05K 7/20* (2006.01)

(56) References Cited

U.S. PATENT DOCUMENTS

| | | | | |
|---|---|---|---|---|
| 2007/0082598 | A1* | 4/2007 | Kempf | H05K 7/20572 454/184 |
| 2008/0041562 | A1* | 2/2008 | Bhatia | H05K 7/20154 257/E23.099 |
| 2008/0151501 | A1* | 6/2008 | Takasou | H05K 7/20154 361/697 |
| 2012/0127664 | A1* | 5/2012 | Shu | G06F 1/20 361/695 |
| 2012/0307447 | A1* | 12/2012 | Wu | G06F 1/20 361/679.48 |
| 2013/0223006 | A1* | 8/2013 | Lin | G06F 1/16 361/679.58 |
| 2014/0307382 | A1* | 10/2014 | Moriai | H05K 7/20472 361/679.32 |
| 2018/0206361 | A1* | 7/2018 | Shirakami | H05K 7/20145 |
| 2019/0053401 | A1* | 2/2019 | Chang | H05K 7/20727 |

FOREIGN PATENT DOCUMENTS

| | | |
|---|---|---|
| JP | 10-275883 A | 10/1998 |
| JP | 2005-110428 A | 4/2005 |
| JP | 2007-208116 A | 8/2007 |
| JP | 2018-113402 A | 7/2018 |

* cited by examiner

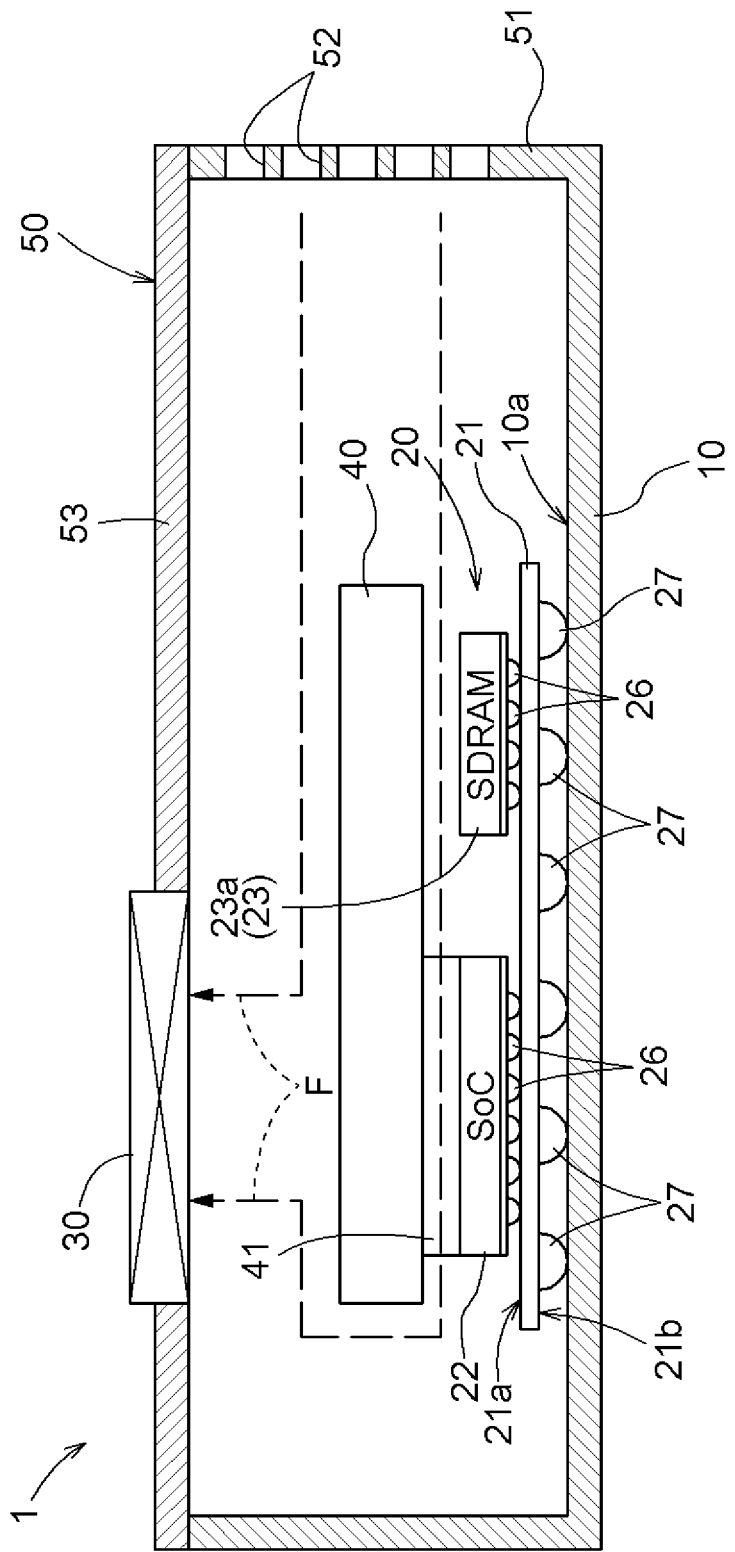

SEMICONDUCTOR DEVICE

CROSS REFERENCE TO RELATED APPLICATIONS

This application is a National Stage of International Application No. PCT/JP2019/048467, filed Dec. 11, 2019, claiming priority to Japanese Patent Application No. 2019-039472, filed Mar. 5, 2019, the entire contents of which are incorporated in their entirety.

TECHNICAL FIELD

The present disclosure relates to a semiconductor device.

BACKGROUND ART

A semiconductor device equipped with a semiconductor module is used. In a semiconductor module mainly including a system LSI such as an SoC (system on a chip) and an SiP (system in a package), elements such as processors provided therein generate heat with operation thereof, so it is necessary to cool the elements with air or the like. Therefore, the semiconductor device may be provided with a fan device for generating an air flow by driving.

An example of the semiconductor device including a semiconductor module and a fan device is disclosed in Japanese Unexamined Patent Application Publication No. 2018-113402 (JP 2018-113402 A) (Patent Document 1). In the semiconductor device of Patent Document 1, the fan 42 takes in air so that an air flow is formed inside the housing 20. The heat generating device 52 and the other devices 53 mounted on the board 50 are arranged such that the heat generating device 52 is located on the upstream side and the other devices 53 are located on the downstream side in the flowing direction of the air flow (see FIG. 11 of Patent Document 1).

RELATED ART DOCUMENTS

Patent Documents

Patent Document 1: Japanese Unexamined Patent Application Publication No. 2018-113402 (JP 2018-113402 A)

SUMMARY OF THE DISCLOSURE

Problem to be Solved by Various Aspects of the Disclosure

However, in the configuration of the semiconductor device of Patent Document 1, the air flow heated by heat exchange with the heat generating device 52 is supplied to the other devices 53. Therefore, for example, when the heat resistance of the other devices is relatively low, it is necessary to secure a wide clearance from the heat generating device 52, which causes an increase in size of the device. On the contrary, if it is attempted to avoid the increase in size, expensive elements having high heat resistance must be adopted, which causes an increase in cost.

Thus, in a semiconductor device including a semiconductor module and a fan device, it is desired to be able to appropriately cool each element mounted on a module board while avoiding an increase in size and cost.

Means for Solving the Problem

A semiconductor device according to the present disclosure is a semiconductor device including: a semiconductor module; and a fan device. The semiconductor module includes a module board, and a first element and a second element mounted on one element mounting surface of the module board; the second element is an element having a smaller heat generation amount and lower heat resistance than the first element; and in a flowing direction of an air flow formed by driving the fan device, the fan device is disposed downstream of the first element and the second element, and the first element is disposed downstream of the second element.

According to this configuration, the first element having a larger heat generation amount is disposed downstream of the second element. Therefore, even when the air flow formed by driving the fan device is heated by heat exchange with the first element, the influence on the second element is small. Thus, as the second element, an inexpensive element having not so high heat resistance can be adopted, or the second element can be disposed close to the first element. Further, since the air flow after cooling only the second element having a smaller heat generation amount is supplied to the first element, the cooling performance of the first element can also be ensured. Thus, in the semiconductor device including the semiconductor module and the fan device, it is possible to appropriately cool each element mounted on the module board while avoiding an increase in size and cost.

Further features and advantages of the techniques according to the present disclosure will be further clarified by the following description of the embodiments that are exemplary and non-limiting, which will be described with reference to the drawings.

BRIEF DESCRIPTION OF THE DRAWINGS

FIG. 6 is a sectional view of the semiconductor device.

DETAILED DESCRIPTION OF EMBODIMENTS

First Embodiment

A first embodiment of a semiconductor device will be described with reference to the drawings. In the present embodiment, a mode in which the semiconductor device is configured as an ECU (electronic control unit) that is mounted on a vehicle and that controls in-vehicle information devices will be described as an example; however, as a matter of course, the use of the semiconductor device is not limited to this.

Figure 1:
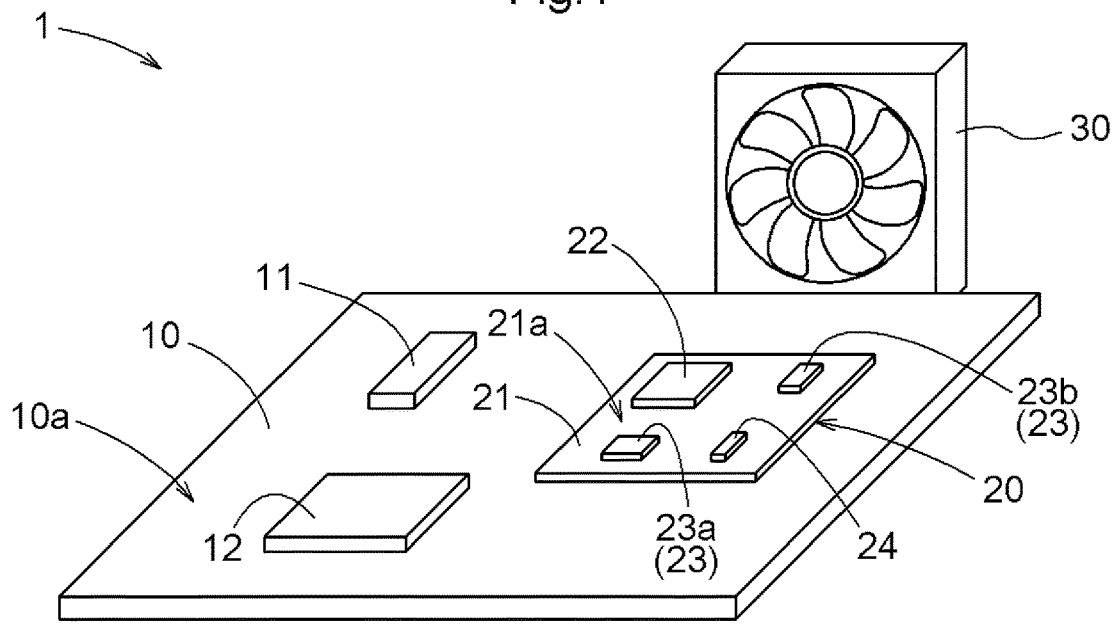
FIG. 1 is a perspective view of a semiconductor device according to a first embodiment.
Figure 2:
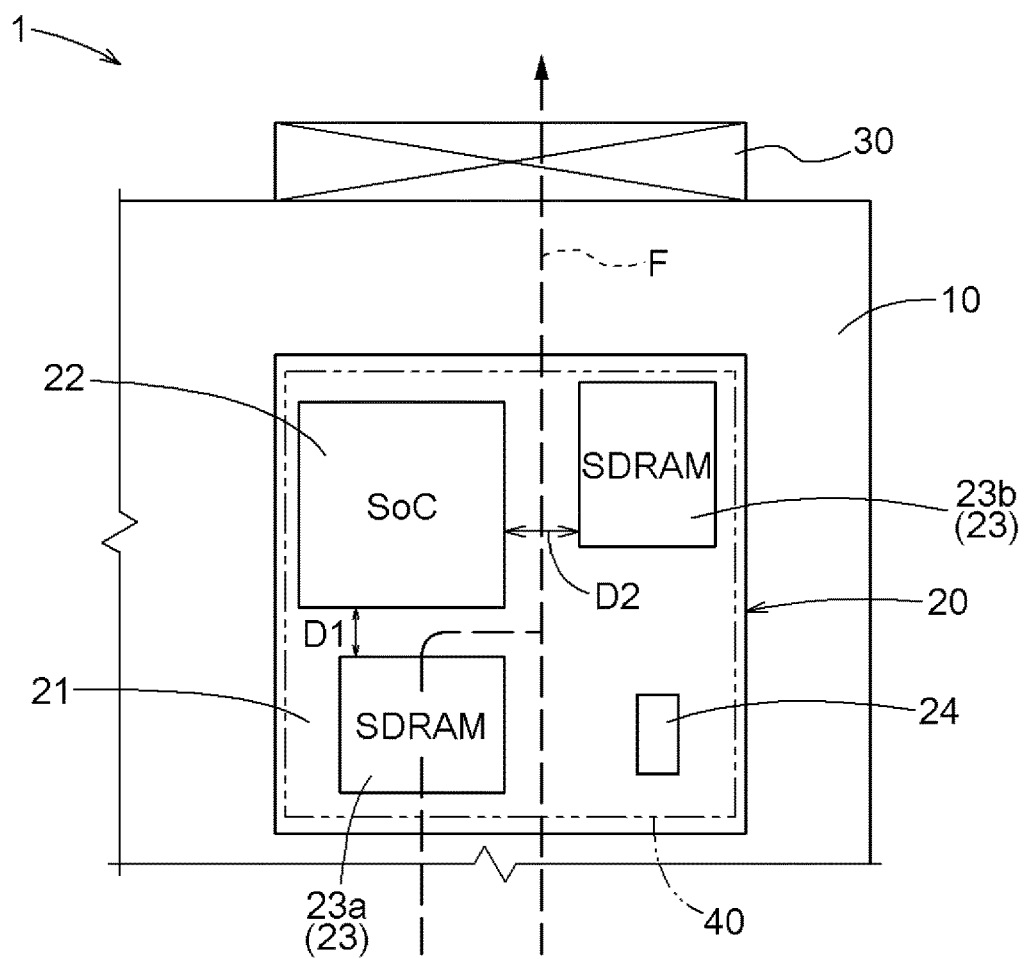
FIG. 2 is a plan view of the semiconductor device.
Figure 3:
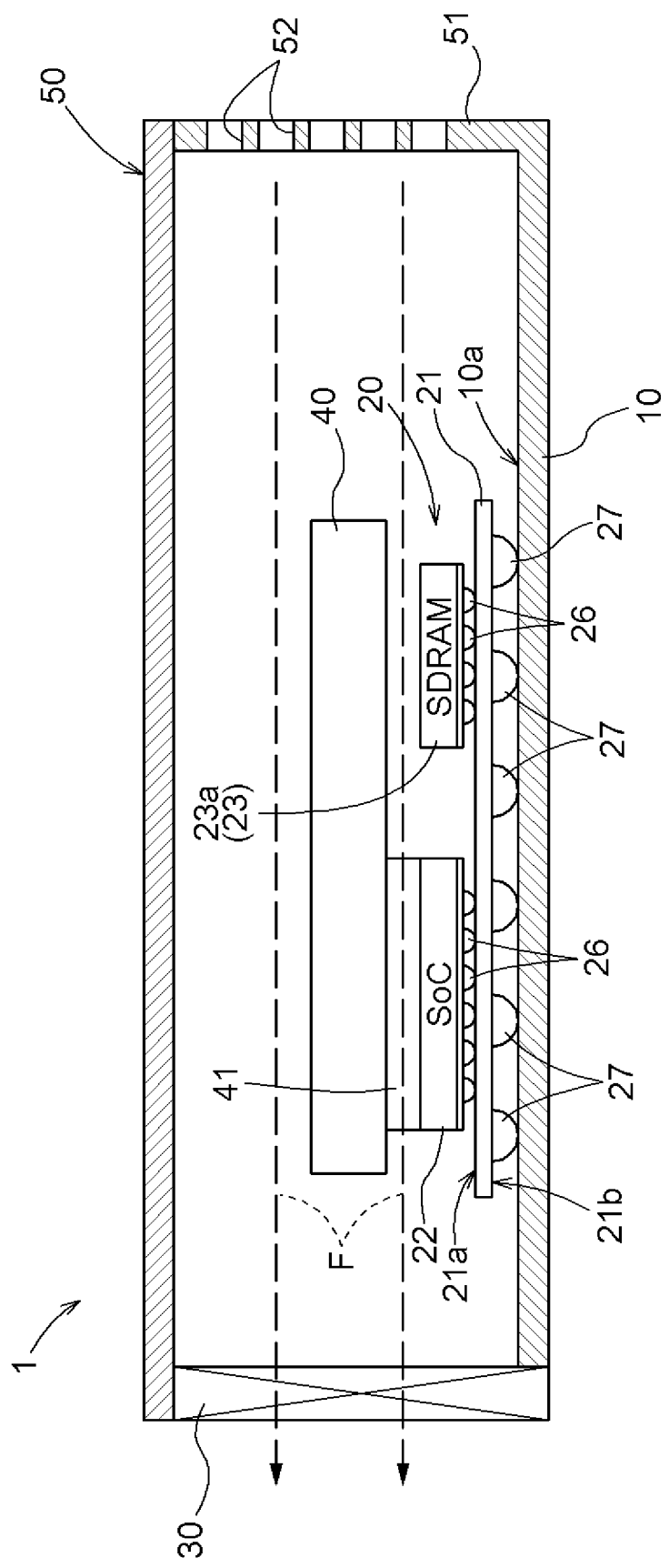
FIG. 3 is a sectional view of the semiconductor device.
Figure 4:
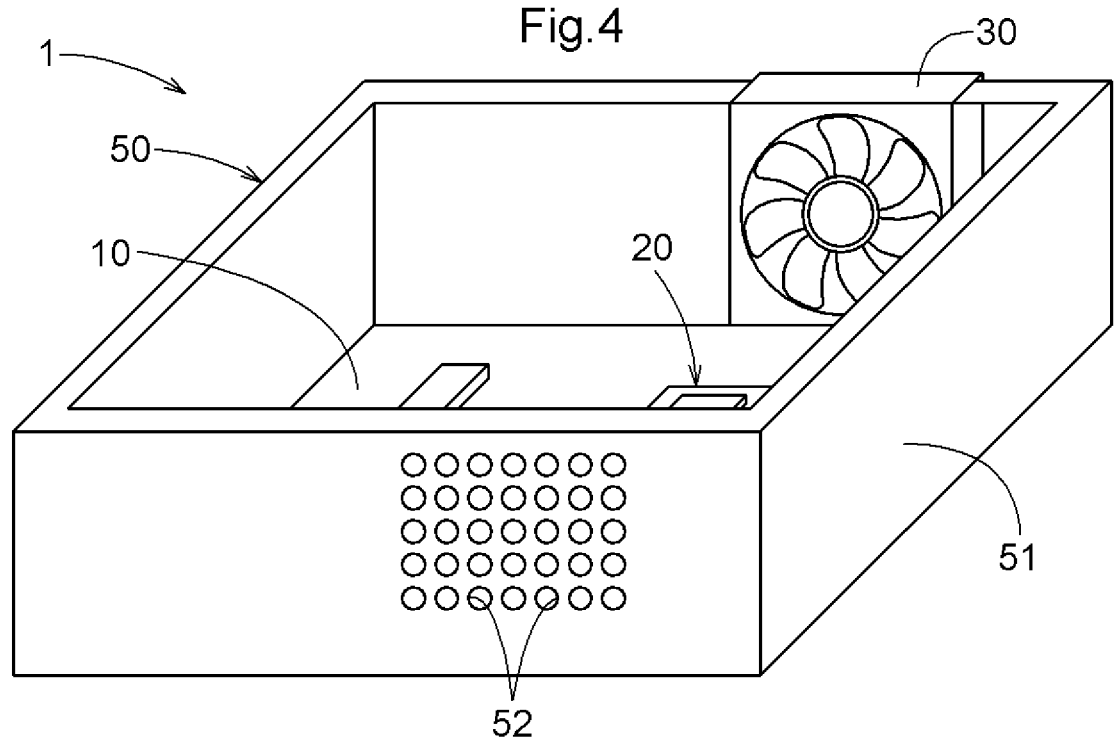
FIG. 4 is a perspective view of the semiconductor device.

As shown in FIG. 1, a semiconductor device 1 includes a main board 10, a semiconductor module 20, and a fan device 30. The semiconductor device 1 further includes a heat sink 40 (see FIGS. 2 and 3). As shown in FIGS. 3 and 4, these are accommodated inside a housing 50. It is preferable that the housing 50 be formed in a rectangular parallelepiped shape. Note that FIG. 4 is a perspective view with a lid portion removed so that the inside of the housing 50 can be easily seen.

The main board 10 is, for example, a motherboard. At least the semiconductor module 20 is mounted on a first surface 10a that is one surface of the main board 10. Further, a main power supply IC 11 and a circuit 12 are mounted on the first surface 10a of the main board 10. The main power supply IC 11 includes a power supply function block capable of generating a plurality of types of electric power. The circuit 12 is connected to a system LSI 22 provided in the semiconductor module 20.

The semiconductor module 20 includes a module board 21, the system LSI 22, a memory 23, and a module power supply IC 24. The module board 21 is formed to have a smaller size than the main board 10. The system LSI 22, the memory 23, and the module power supply IC 24 are mounted on a first surface 21a that is one surface of the module board 21. Further, the semiconductor module 20 includes a first memory 23a and a second memory 23b as the memory 23, and the first memory 23a and the second memory 23b are both mounted on the first surface 21a of the module board 21.

The system LSI 22 is planned to generate heat with its operation, so heat resistance thereof is accordingly high. On the other hand, the memory 23 (first memory 23a and second memory 23b) that only cooperates with the system LSI 22 during operation of the system LSI 22 has a smaller heat generation amount and lower heat resistance than the system LSI 22. In the present embodiment, the system LSI 22 corresponds to a "first element", the first memory 23a corresponds to a "second element", and the second memory 23b corresponds to a "third element". Further, the first surface 21a on which the system LSI 22, the first memory 23a, and the second memory 23b are commonly mounted corresponds to an "element mounting surface".

The system LSI 22 is a processor that performs various arithmetic processes. In the present embodiment, as shown in FIG. 2, an SoC (system on a chip) is used as the system LSI 22. However, the system LSI 22 is not limited to such a configuration, and an SiP (system in a package) may be used as the system LSI 22.

Further, two SDRAMs (synchronous dynamic random access memories) are used as the memory 23 (first memory 23a and second memory 23b). The SDRAM is preferably, for example, a DDR3 (double data rate 3) SDRAM, a DDR4 (double data rate 4) SDRAM, and the like. However, the memory 23 is not limited to such a configuration, and a flash memory, an SRAM (static RAM), and the like may be used as the memory 23.

The module power supply IC 24 includes a power supply function block capable of generating at least one type of electric power.

As shown in FIG. 3, the system LSI 22, the first memory 23a, and the second memory 23b are mounted on the first surface 21a of the module board 21 via hemispherical chip terminals 26 that are regularly arranged on the first surface 21a of the module board 21. That is, the semiconductor module 20 is configured as a multi-chip module including, on the module board 21, the system LSI 22 that is a processor and the memory 23 (first memory 23a, second memory 23b) that cooperates with the system LSI 22.

The semiconductor module 20 is mounted on the first surface 10a of the main board 10 via hemispherical module terminals 27 that are regularly arranged between the first surface 10a of the main board 10 and a second surface 21b of the module board 21 that is a surface on the opposite side of the module board 21 from the surface on which the system LSI 22 and the like are mounted.

The heat sink 40 is formed so as to cover the system LSI 22, the first memory 23a, and the second memory 23b. In the present embodiment, as shown in FIG. 2, the heat sink 40 is formed to have about the same size as (a slightly smaller size than) the module board 21. The heat sink 40 is disposed on the opposite side of the system LSI 22, the first memory 23a, and the second memory 23b from the module board 21. The heat sink 40 is disposed so as to be in contact with the system LSI 22 on the opposite side of the system LSI 22 from the side on which the chip terminals 26 are provided. The heat sink 40 includes a raised portion 41 that protrudes toward the system LSI 22 side, and the protruding end surface of the raised portion 41 is in contact with the system LSI 22.

The heat sink 40 is not in contact with the first memory 23a and the second memory 23b. That is, the heat sink 40 is disposed while being spaced away from the first memory 23a and the second memory 23b in the up-down direction (direction orthogonal to the module board 21). It is preferable that a plurality of fins be provided on the surface on the opposite side of the heat sink 40 from the side on which the system LSI 22 and the memory 23 are provided.

The fan device 30 is an exhaust device for discharging air inside the housing 50 to the outside of the housing 50. The fan device 30 is composed of an exhaust fan that is rotationally driven by, for example, a fan motor or the like and that discharges the air inside the housing 50 to the outside. As shown in FIGS. 3 and 4, the housing 50 is also provided with intake ports 52 for taking in external air into the housing 50. In the present embodiment, the housing 50 has a peripheral wall portion 51 that surrounds the semiconductor module 20 and the heat sink 40, and the peripheral wall portion 51 is provided with the intake ports 52. When the housing 50 is formed in a rectangular parallelepiped shape as in the present embodiment, it is preferable that the intake ports 52 and the fan device 30 be separately provided at positions of the peripheral wall portion 51 that face each other with the semiconductor module 20 interposed therebetween. In other words, it is preferable that the intake ports 52 be provided at a portion of the peripheral wall portion 51 that faces a portion of the peripheral wall portion at which the fan device 30 is installed with the semiconductor module 20 interposed between the portions.

As shown in FIGS. 1 and 2, the fan device 30 is disposed at a position corresponding to the installation area for the semiconductor module 20 on the main board 10. The fan device 30 is disposed so that the rotation axis of the exhaust fan passes through the installation area for the semiconductor module 20. Thereby, an air flow F that flows into the housing 50 from the intake ports 52 by driving of the fan device 30 and formed in the housing 50 traverses the semiconductor module 20 and the heat sink 40, as shown in FIG. 2.

Further, the intake ports 52 and the fan device 30 are provided at positions on the side on which the system LSI 22 is disposed in the semiconductor module 20. Further, the intake ports 52 are provided at a position close to the first memory 23a in the semiconductor module 20, and the fan device 30 is provided at a position close to the system LSI 22 in the semiconductor module 20. This makes it easier to guide the air flow F formed by driving the fan device 30 to the periphery of the system LSI 22 that has a large heat generation amount. Therefore, the system LSI 22 can be cooled efficiently.

As shown in FIGS. 2 and 3, the fan device 30 for discharging the air inside the housing 50 to the outside is disposed, as a matter of course, downstream of the system LSI 22 and the first memory 23a in the flowing direction of the air flow F. In the present embodiment, the system LSI 22 is disposed downstream (on the fan device 30 side) of the first memory 23a in the flowing direction of the air flow F. Since the system LSI 22 having a larger heat generation amount is disposed downstream of the first memory 23a, even if the air flow F is heated by the system LSI 22, the influence on the first memory 23a is small. Thus, as the first memory 23a, an inexpensive element having not so high heat resistance can be adopted, and the cost can be reduced.

As shown in FIG. 2, the second memory 23b and the system LSI 22 are arranged side by side in a direction orthogonal to the flowing direction of the air flow F. Here, "arranged side by side in the direction orthogonal to the flowing direction of the air flow F" means that the system LSI 22 and the second memory 23b each having a size that occupies a predetermined range are arranged, as a whole, at about the same positions in the flowing direction of the air flow F with the passage of the air flow F interposed therebetween. Therefore, as in the example shown in FIG. 2, the second memory 23b may be disposed slightly more toward the fan device 30 side than the system LSI 22, and vice versa.

The first memory 23a disposed upstream of the system LSI 22 is less affected by the heat of the system LSI 22 than the second memory 23b disposed at the side of the system LSI 22. Thus, in the present embodiment, an arrangement clearance D1 between the system LSI 22 and the first memory 23a is set to be narrower than an arrangement clearance D2 between the system LSI 22 and the second memory 23b (D1<D2). That is, the first memory 23a, which is less affected by the heat of the system LSI 22, is disposed closer to the system LSI 22 than the second memory 23b. As a result, the size of the semiconductor module 20 and therefore the size of the semiconductor device 1 as a whole can be reduced.

By securing the arrangement clearance D2 between the system LSI 22 and the second memory 23b wider, it is possible to provide a nozzle insertion port for applying underfill (for example, a liquid curable resin such as an epoxy resin) to the area between the system LSI 22 and the second memory 23b. It is preferable that the nozzle insertion port be used for both filling for the chip terminals 26 related to the system LSI 22 and filling for the chip terminals 26 related to the second memory 23b.

As shown in FIG. 3, the air flow F formed by driving the fan device 30 is divided into a flow passing above the heat sink 40 and a flow passing below the heat sink 40. There is nothing that blocks the air flow F passing above the heat sink 40, or even if any, there is only the plurality of fins of the heat sink 40, so the air flow F extends linearly toward the fan device 30 (as indicated by the right part of the broken line arrow in FIG. 2). On the other hand, part of the air flow F passing below the heat sink 40 flows through the gap between the first memory 23a and the heat sink 40, and then is blocked by the first memory 23a and the raised portion 41 of the heat sink 40. Therefore, the air flow F flows in a cranked manner in plan view, bypassing the raised portion 41 and heading toward the fan device 30 (as indicated by the left part of the broken line arrow in FIG. 2).

Second Embodiment

A second embodiment of a semiconductor device will be described with reference to the drawings. In the semiconductor device 1 of the present embodiment, the installation position of the fan device 30 in the housing 50 is different from that in the first embodiment. Hereinafter, the semiconductor device 1 of the present embodiment will be described focusing on the difference from the first embodiment. The points that are not particularly mentioned are the same as those in the first embodiment, and the same reference numerals are given and detailed description thereof will be omitted.

Figure 5:
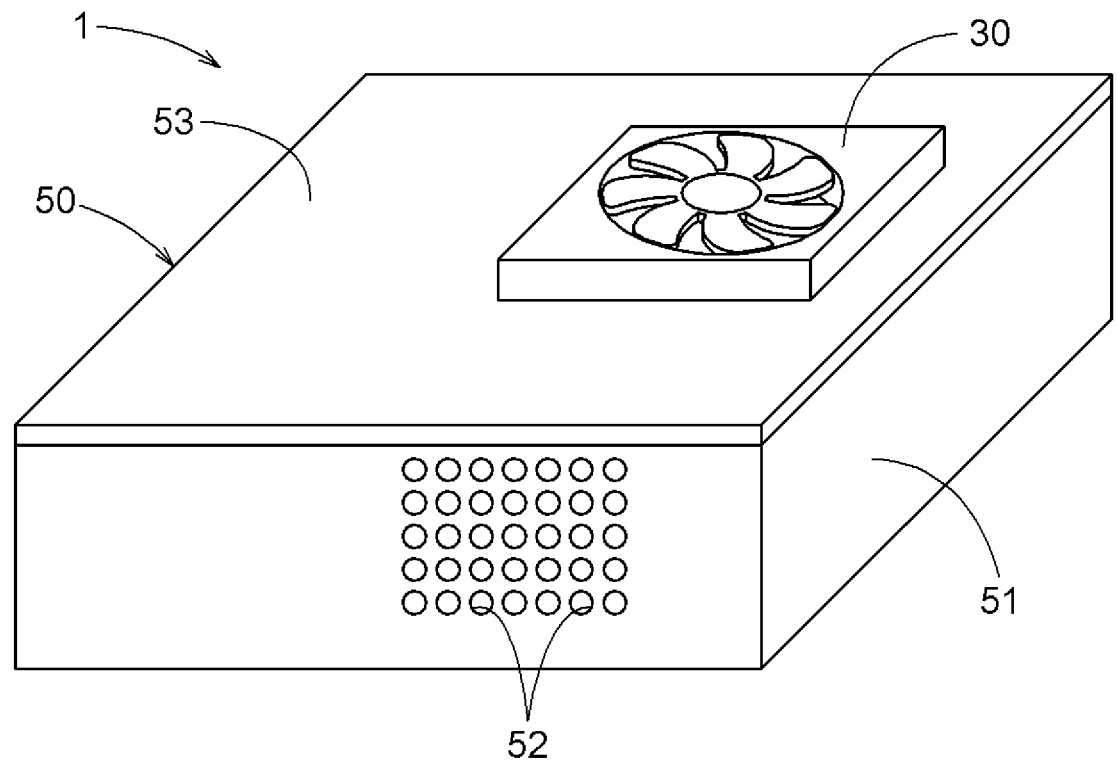
FIG. 5 is a perspective view of a semiconductor device according to a second embodiment.

As shown in FIG. 5, the housing 50 of the present embodiment also has the peripheral wall portion 51 that surrounds the semiconductor module 20 and the heat sink 40. In FIG. 5, a lid portion 53 covering the upper opening of the peripheral wall portion 51 is also shown. In the semiconductor device 1 of the present embodiment, the intake ports 52 are provided in the peripheral wall portion 51, and the fan device 30 is provided in the lid portion 53. The intake ports 52 are provided at a position of the peripheral wall portion 51 that is close to the first memory 23a in the semiconductor module 20. As shown in FIG. 6, the fan device 30 is provided at a portion of the lid portion 53 above the system LSI 22 (a position having a portion overlapping the system LSI 22 in plan view).

In such a configuration, as shown in FIG. 6, the air flow F formed by driving the fan device 30 flows along the heat sink 40 and then bends upward toward the fan device 30, that is, flows in a generally L-shape in side view.

Other Embodiments (1) In the above embodiments, the configuration in which the semiconductor module 20 includes both the first memory 23a and the second memory 23b as the memory 23 has been described as an example. However, the present disclosure is not limited to such a configuration, and for example, only the first memory 23a may be provided as the memory 23, and the second memory 23b may not be provided.

(2) In the above embodiments, the configuration in which the arrangement clearance D1 between the system LSI 22 and the first memory 23a is set to be narrower than the arrangement clearance D2 between the system LSI 22 and the second memory 23b has been described as an example. However, the present disclosure is not limited to such a configuration, and for example, the arrangement clearance D1 between the system LSI 22 and the first memory 23a and the arrangement clearance D2 between the system LSI 22 and the second memory 23b may be set to be equal to each other. Alternatively, depending on the other conditions, the arrangement clearance D1 between the system LSI 22 and the first memory 23a may be set to be wider than the arrangement clearance D2 between the system LSI 22 and the second memory 23b.

(3) In the above embodiments, the configuration in which the semiconductor module 20 is a multi-chip module including the system LSI 22 and the memory 23 that cooperates with the system LSI 22 has been described as an example. However, the present disclosure is not limited to such a configuration, and for example, the semiconductor module 20 may be configured by combining a single-chip module including the system LSI 22 and a single-chip module including the memory 23.

(4) In the above embodiments, the configuration in which the semiconductor device 1 is provided with the heat sink 40 disposed so as to be in contact with the system LSI 22 and so as not to be in contact with the memory 23 has been described as an example. However, the present disclosure is not limited to such a configuration, and for example, the heat sink 40 may be disposed so as to be in contact with both the system LSI 22 and the memory 23. Alternatively, the semiconductor device 1 may be configured not to include the heat sink 40.

(5) The configuration disclosed in each of the above-described embodiments (including the above-described embodiments and other embodiments; the same applies hereinafter) can be applied in combination with configurations disclosed in other embodiments, as long as no contradiction arises. As for the other configurations, the embodiments disclosed in the present specification are examples in all respects, and can be appropriately modified without departing from the scope of the present disclosure.

SUMMARY OF EMBODIMENTS

Summarizing the above, the semiconductor device according to the present disclosure preferably has the following configurations.

A semiconductor device (1) includes: a semiconductor module (20); and a fan device (30). The semiconductor module (20) includes a module board (21), and a first element (22) and a second element (23a) mounted on one element mounting surface (21a) of the module board (21). The second element (23a) is an element having a smaller heat generation amount and lower heat resistance than the first element (22), and in a flowing direction of an air flow (F) formed by driving the fan device (30), the fan device (30) is disposed downstream of the first element (22) and the second element (23a), and the first element (22) is disposed downstream of the second element (23a).

According to this configuration, the first element (22) having a larger heat generation amount is disposed downstream of the second element (23a). Therefore, even when the air flow (F) formed by driving the fan device (30) is heated by heat exchange with the first element (22), the influence on the second element (23a) is small. Thus, as the second element (23a), an inexpensive element having not so high heat resistance can be adopted, or the second element (23a) can be disposed close to the first element (22). Further, since the air flow (F) after cooling only the second element (23a) having a smaller heat generation amount is supplied to the first element (22), the cooling performance of the first element (22) can also be ensured. Thus, in the semiconductor device (1) including the semiconductor module (20) and the fan device (30), it is possible to appropriately cool each element mounted on the module board (21) while avoiding an increase in size and cost.

As one aspect, the semiconductor module (20) further includes a third element (23b) having a smaller heat generation amount and lower heat resistance than the first element (22), the third element being mounted on the element mounting surface (21a); the third element (23b) and the first element (22) are arranged side by side in a direction orthogonal to the flowing direction of the air flow (F); and an arrangement clearance (D1) between the first element (22) and the second element (23a) is set to be narrower than an arrangement clearance (D2) between the first element (22) and the third element (23b).

Heat from the first element (22) is less likely to be transferred to the second element (23a) disposed upstream of the first element (22) in the flowing direction of the air flow (F), than to the third element (23b) with which the first element (22) is arranged side by side in the direction orthogonal to the flowing direction of the air flow (F). Thus, as in the above configuration, the arrangement clearance (D1) between the first element (22) and the second element (23a) is set to be narrower than the arrangement clearance (D2) between the first element (22) and the third element (23b), so that it is possible to appropriately suppress the increase in size of the semiconductor device (1).

As one aspect, it is preferable that the semiconductor device further include a heat sink (40) that is disposed so as to be in contact with the first element (22).

With this configuration, heat generated with the operation of the first element (22) can be rapidly diffused to the heat sink (40). Further, the first element (22) can be cooled more appropriately by heat exchange between the air flow (F) and the heat sink (40).

As one aspect, it is preferable that the semiconductor module (20) be a multi-chip module including, on the module board (21), a processor that serves as the first element (22) and a memory that cooperates with the processor and serves as the second element (23a).

With this configuration, it is possible to reduce in size of the semiconductor module (20) composed of the multi-chip module. Thus, it is possible to reduce in size of the semiconductor device (1).

As one aspect, it is preferable that the semiconductor device further include a housing (50) for accommodating the semiconductor module (20) and an intake port (52) provided in the housing (50). It is preferable that the housing (50) have a peripheral wall portion (51) that surrounds the semiconductor module (20), and the intake port (52) and the fan device (30) be separately provided at portions of the peripheral wall portion (51), the portions facing each other with the first element (22) and the second element (23a) interposed between the portions.

With this configuration, the air flow (F) from the intake port (52) toward the fan device (30) can be appropriately directed toward the semiconductor module (20). Thus, the first element (22) and the second element (23a) can be appropriately cooled.

As one aspect, it is preferable that the semiconductor device further include a housing (50) for accommodating the semiconductor module (20) and an intake port (52) provided in the housing (50). It is preferable that the housing (50) have a peripheral wall portion (51) that surrounds the semiconductor module (20) and a lid portion (53) that covers an upper opening of the peripheral wall portion (51), and the intake port (52) be provided in the peripheral wall portion (51), and the fan device (30) be provided in the lid portion (53).

With this configuration, for example, by providing the fan device (30) in the lid portion (53) above the semiconductor module (20), the air flow (F) from the intake port (52) toward the fan device (30) can be appropriately directed toward the semiconductor module (20). Thus, the first element (22) and the second element (23a) can be appropriately cooled.

The semiconductor device according to the present disclosure only needs to be capable of exhibiting at least one of the effects described above.

DESCRIPTION OF THE REFERENCE NUMERALS 1 semiconductor device
20 semiconductor module
21 module board
21a first surface (element mounting surface)
22 system LSI (first element)
23a first memory (second element)
23b second memory (third element)
30 fan device
40 heat sink
50 housing
51 peripheral wall portion 52 intake port
53 lid portion
F air flow

The invention claimed is:

1. A semiconductor device comprising: a semiconductor module; and a fan device, wherein:
   the semiconductor module includes a module board, and a first element and a second element mounted on one element mounting surface of the module board;
   the second element is an element having a smaller heat generation amount and lower heat resistance than the first element; and
   in a flowing direction of an air flow formed by driving the fan device, the fan device is disposed downstream of the first element and the second element, and the first element is disposed downstream of the second element, wherein:
   the semiconductor module further includes a third element having a smaller heat generation amount and lower heat resistance than the first element, the third element being mounted on the element mounting surface;
   the third element and the first element are arranged side by side in a direction orthogonal to the flowing direction of the air flow and overlapped when viewed in the direction orthogonal to the flowing direction; and
   an arrangement clearance between the first element and the second element is set to be narrower than an arrangement clearance between the first element and the third element.

2. The semiconductor device according to claim 1, further comprising a heat sink that is disposed so as to be in contact with the first element.

3. The semiconductor device according to claim 1, wherein the semiconductor module is a multi-chip module including, on the one element-mounting surface, a processor that serves as the first element and a memory that cooperates with the processor and serves as the second element.

4. The semiconductor device according to claim 1, further comprising: a housing for accommodating the semiconductor module; and an intake port provided in the housing, wherein:
   the housing has a peripheral wall portion that surrounds the semiconductor module; and
   the intake port and the fan device are separately provided at portions of the peripheral wall portion, the portions facing each other with the first element and the second element interposed between the portions.

5. The semiconductor device according to claim 1, further comprising:
   a housing for accommodating the semiconductor module; and an intake port provided in the housing, wherein:
   the housing has a peripheral wall portion that surrounds the semiconductor module and a lid portion that covers an upper opening of the peripheral wall portion; and
   the intake port is provided in the peripheral wall portion, and the fan device is provided in the lid portion.

* * * * *